United States Patent
Schnetker

(10) Patent No.: US 8,461,588 B2
(45) Date of Patent: Jun. 11, 2013

(54) IN-SITU MONITORING AND METHOD TO DETERMINE ACCUMULATED PRINTED WIRING BOARD THERMAL AND/OR VIBRATION STRESS FATIGUE USING A MIRRORED MONITOR CHIP AND CONTINUITY CIRCUIT

(75) Inventor: Ted R. Schnetker, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 530 days.

(21) Appl. No.: 12/628,276

(22) Filed: Dec. 1, 2009

(65) Prior Publication Data

US 2010/0073022 A1   Mar. 25, 2010

Related U.S. Application Data

(62) Division of application No. 11/474,540, filed on Jun. 26, 2006, now Pat. No. 7,648,847.

(51) Int. Cl.
*H01L 23/58* (2006.01)

(52) U.S. Cl.
USPC ............... 257/48; 257/673; 257/778; 438/11; 438/14; 438/15

(58) Field of Classification Search
USPC .................. 257/48, 673, 778; 438/11, 14, 15, 438/18
See application file for complete search history.

(56) References Cited

U.S. PATENT DOCUMENTS

| | | | |
|---|---|---|---|
| 4,112,747 A | 9/1978 | Aldridge et al. | |
| 4,598,592 A | 7/1986 | McMaster | |
| 5,491,364 A | 2/1996 | Brandenburg et al. | |
| 5,572,405 A | 11/1996 | Wilson et al. | |
| 5,600,257 A | 2/1997 | Leas et al. | |
| 5,768,774 A | 6/1998 | Wilson et al. | |
| 5,838,568 A * | 11/1998 | Dickinson et al. | 700/121 |
| 6,002,172 A | 12/1999 | Desai et al. | |
| 6,187,418 B1 | 2/2001 | Fasano et al. | |
| 6,251,766 B1 | 6/2001 | Desai et al. | |
| 6,281,581 B1 | 8/2001 | Desai et al. | |
| 6,333,563 B1 | 12/2001 | Jackson et al. | |
| 6,341,071 B1 | 1/2002 | Johnson et al. | |
| 6,344,737 B1 | 2/2002 | Yap et al. | |
| 6,391,681 B1 | 5/2002 | Corisis | |
| 6,392,291 B1 | 5/2002 | Corisis | |
| 6,429,029 B1 * | 8/2002 | Eldridge et al. | 438/14 |
| 6,452,502 B1 | 9/2002 | Dishongh et al. | |
| 6,537,850 B1 | 3/2003 | Corisis | |
| 6,682,802 B2 | 1/2004 | Hsieh et al. | |
| 6,774,474 B1 | 8/2004 | Caletka et al. | |
| 6,784,086 B2 | 8/2004 | Ray et al. | |
| 6,913,948 B2 | 7/2005 | Caletka et al. | |
| 7,102,377 B1 | 9/2006 | Blanchet et al. | |
| 7,196,294 B2 * | 3/2007 | Hofmeister et al. | 219/499 |
| 2005/0090027 A1 * | 4/2005 | Aghababazadeh et al. | 438/17 |
| 2007/0296068 A1 * | 12/2007 | Schnetker | 257/669 |

* cited by examiner

*Primary Examiner* — Thinh T Nguyen
(74) *Attorney, Agent, or Firm* — Carlson, Gaskey & Olds, P.C.

(57) ABSTRACT

A monitoring system includes a monitor chip or chips soldered to a printed wiring board. By mirroring a function IC chip interface with the monitor chip, the consumed and remaining thermal/and or vibration-fatigue life of the function IC chip based on the life-environment actually experienced through monitoring of the monitor chip is readily determined. The monitor chip includes monitoring interconnections and/or circuitry which determines the number and/or location of failed-open solder terminations of the monitor chip.

12 Claims, 4 Drawing Sheets

IN-SITU MONITORING AND METHOD TO DETERMINE ACCUMULATED PRINTED WIRING BOARD THERMAL AND/OR VIBRATION STRESS FATIGUE USING A MIRRORED MONITOR CHIP AND CONTINUITY CIRCUIT

This application is a divisional application of U.S. patent application Ser. No. 11/474,540, filed Jun. 26, 2006 now U.S. Pat. No. 7,648,847.

BACKGROUND OF THE INVENTION

The present invention relates to determining the accumulated thermal and or vibration fatigue stress fatigue of an electronic system, and more particularly to a mirrored continuity circuit to determine the accumulated printed wiring board fatigue damage.

During its design life, an electronic system can be exposed to a wide variety of vibration and thermal cycling environments. In order to reduce testing time and cost, laboratory tests are usually conducted on products in a time-accelerated manner to create a generalized analytic model that is applied to average or generalized anticipated operating conditions to predict service life of products.

Integrated circuit (IC) chips are often soldered to conductor patterns formed on a circuit board, which may be a ceramic substrate or printed wiring board, in a manner which both secures and electrically interconnects the IC chip to the circuit board. Terminals are formed on the lower surface of the IC chip such that, when the chip is registered with the conductor pattern, each terminal will individually register with a single conductor of the conductor pattern. A solder reflow technique is then typically used to reflow the terminals and metallurgically bond them to their respective conductors.

Due to the numerous functions performed by integrated circuits, a relatively large number of terminals are required to interconnect the IC chip to the conductor pattern. Furthermore, because the size of an IC chip can be as little as a few millimeters per side, the size and spacing of the terminals and the conductors must be closely controlled in order to properly align and mount an IC chip to the corresponding terminal pattern formed on its circuit board.

A method which is widely practiced by the industry for soldering IC chips to a substrate is the flip-chip bonding process. This process utilizes an integrated circuit flip chip, which is generally a monolithic semiconductor device having bead-like terminals, or solder bumps, provided on one face of the chip. The solder bumps form a bump pattern and serve as interconnects between the IC chip and its corresponding conductor pattern on the substrate to which the flip chip is to be soldered by reflowing the solder bumps.

In the field of integrated circuits packaging, a ball grid array package (BGA package) is a common type utilized in ICs packaging in which the plurality of bumps form the BGA in a flip chip fashion. As an example, a conventional flip chip bump pattern composed of eighty-eight solder bumps arranged as a rectangular array with a row of twenty-two solder bumps to a side, with each row being adjacent an edge of the flip chip. In order to properly register with the single row, rectangular arrangement of this particular bump pattern, the individual conductors of this flip chip's conductor pattern are also so spaced. Because of the close placement of the solder bumps and conductors, the techniques used to pattern the bump and conductor patterns on the surface of the flip chip and to solder the flip chip to its conductor pattern require a significant degree of precision. The size and composition of the solder bumps must also be closely controlled to achieve the required reliability, bond integrity and electrical characteristics, while concurrently eliminating the potential for electrical shorting between adjacent solder bumps and adjacent conductors.

While presently known techniques used to form the terminal and conductor patterns for flip chip and ball grid array packages are generally sufficient, electronic systems are complex structures with characteristics that may make accurate predictive analysis quite difficult. One area of concern is the fatigue life of the solder joints formed by the terminals with the conductors, and more specifically, the stress induced in the solder joints as a result of temperature effects and differences in coefficients of thermal expansion of the materials used.

Further complicating predictive analysis is that the life-environment actually experienced by each particular electronic system is unique. Such individuality is particularly prevalent in the vibration-fatigue life of military and commercial avionic systems. Predictive analysis, although effective, may not define the risk for all possible failures for individual systems which may result in unnecessary anticipatory preventative maintenance and repair which may increase the associated life cycle costs, or inability to predict imminent failure which can create economic or human costs when failure occurs.

Accordingly, it is desirable to provide an in-situ monitoring system and method to determine if an individual electronic system is near the end of a thermal or vibration-fatigue life based on the life-environment actually experienced.

SUMMARY OF THE INVENTION

A monitoring system for an electronic component according to the present invention includes a monitor chip soldered to a printed circuit board with a number of wires and a complimentary conductor pattern. By mirroring a functional IC chip substrate interface with the monitor chip substrate interface, the vibration/thermal-fatigue life of the functional IC chip based on the life-environment actually experienced through monitoring of the monitor chip is readily determined. That is, the monitor chip, having essentially the same solder termination substrate interface as the functional IC chip, experiences essentially the same mechanical vibration and thermal fatigue stress as the functional IC chip.

The monitor chip type, size, or mounting parameters, such as specific underfill materials or methods, are selected to be more rapidly susceptible to failure due to accumulated stress (thermal or vibration or a combination of stresses) than the functional circuit elements in the design. The actual difference in susceptibility can be determined by testing to failure of samples of the monitor chip/functional chip design.

The monitor chip includes monitoring circuitry which determines the number of failed-open solder terminations. The monitoring circuitry may contain daisy chain wiring, or other circuitry that can be monitored through circuits internal or external of the monitor chip to determine the number and/or location of solder terminations associated with the monitor chip that have failed and are electrically open. By utilizing the characteristic cycles and total stress to failure relationship between the monitor chip(s) and functional IC chip(s), the monitoring circuitry establishes the percentage of the design stress-to-failure that has occurred for the functional IC chip.

The large number of solder terminations available by using high density packages such as flip chip and ball grid arrays as monitor chips facilitates calculation of the total accumulated fatigue experienced by any given assembly by using a large sample set of individual terminations. This provides higher levels of accurate total fatigue estimation through large sample sizes than individual accumulated stress types of in-situ sensors. When statistical relationships between monitor chip and functional chip fatigue-to-failure are known, the large number of individual solder terminations available on each monitor chip(s) allow narrow statistical confidence bands to be calculated to accurately predict the fatigue stress encountered to date by the individual assembly on which the monitor chip(s) is(are) mounted based on the number of monitor chip(s) solder terminations and/or locations that have failed to date.

The present invention therefore provide an in-situ monitoring system and method to determine if an electronic system is near the end of a thermal fatigue or vibration-fatigue life based on the life-environment actually experienced by an individual system.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1:
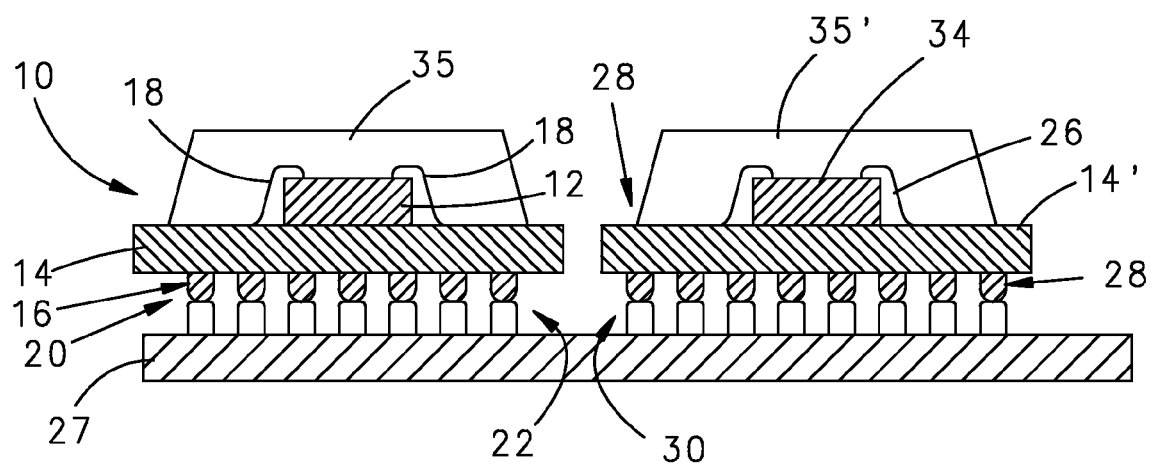
FIG. 1 is a general perspective view of exemplary electronic integrated circuits mounted to a printed wiring board using surface mount solder terminations.

FIG. 1 illustrates an electronic package 10 having a function IC chip 12 which is wire bonded to a lead frame/package 14 with a number of wires 18. The function IC chip 12 and wires 18 are preferably encapsulated in an encapsulation material 35. The function IC chip 12 as utilized herein may be any semiconductor chip which performs any desired function. Shown here as an example package types are Ball Grid Arrays (BGA). Ball Grid Arrays (BGA) are widely used to electrically and mechanically connect substrate (typically ceramic) carrying semiconductor chips to a card. The BGA attachment method commonly consists of an array of metal pads which are soldered to connecting pads on both the Printed Wiring Board (PWB).

The wires 18 are routed through the BGA package 14 to terminals, or pads 16, on the opposite surface of the BGA package 14. Similar to the flip-chip process, the pads 16 form a pad pattern 20 (FIG. 2) that serves as interconnects between the integrated circuit chip 12 and its corresponding conductor pattern 22 on a printed circuit board 27.

One pad pattern 20 (FIG. 2) and a complimentary PWB conductor pattern 22 having circuit traces 24 (FIG. 3) for a ball grid array package of the function IC chip 12 is illustrated. It should be understood, however, that any pattern will likewise be usable with the present invention. The pad pattern 20 on the surface of the board 14, conductor pattern 22 on the surface of the PWB 27 to which the BGA 14 is to be soldered, and soldering of the BGA 14 to the conductor pattern 22 requires significant precision. As with the flip chip process, the size and composition of the conductor pattern 22 is closely controlled to achieve the required reliability, bond integrity and electrical characteristics, while concurrently eliminating the potential for electrical shorting between the pad pattern 20, the conductor pad pattern 22, and adjacent conductor traces 24.

Figure 2:
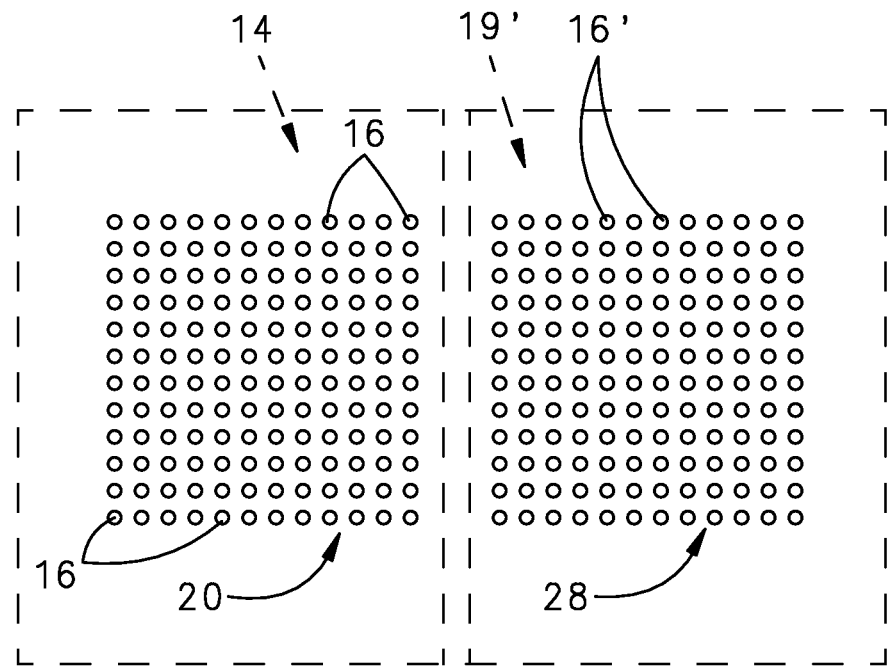
FIG. 2 is a termination layout diagram of the solder terminations of these exemplary components.
Figure 3:
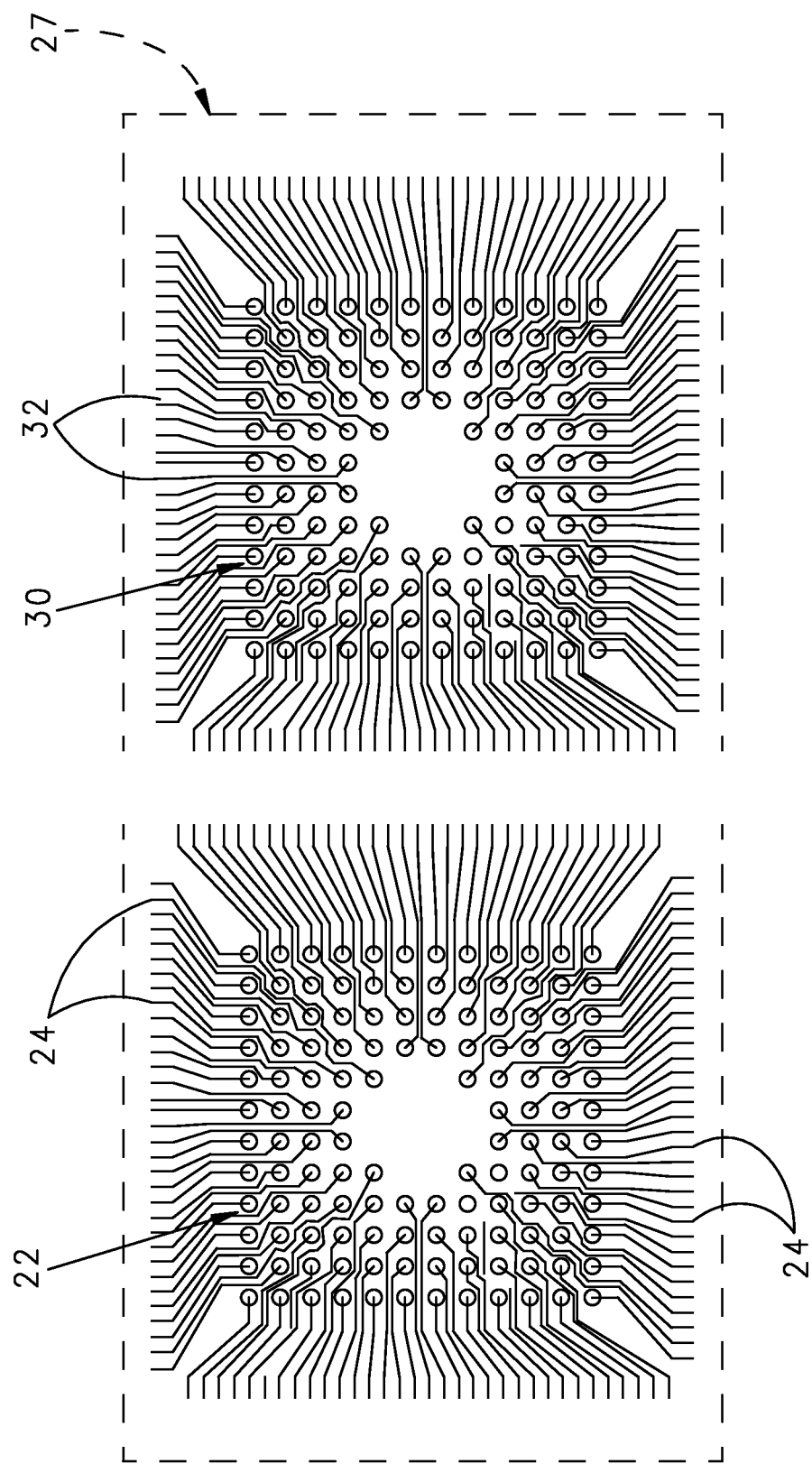
FIG. 3 is a exemplary diagram showing interconnections between particular solder termination points on the underside of the electronic component with internal signal paths within the devices.
Figure 4:
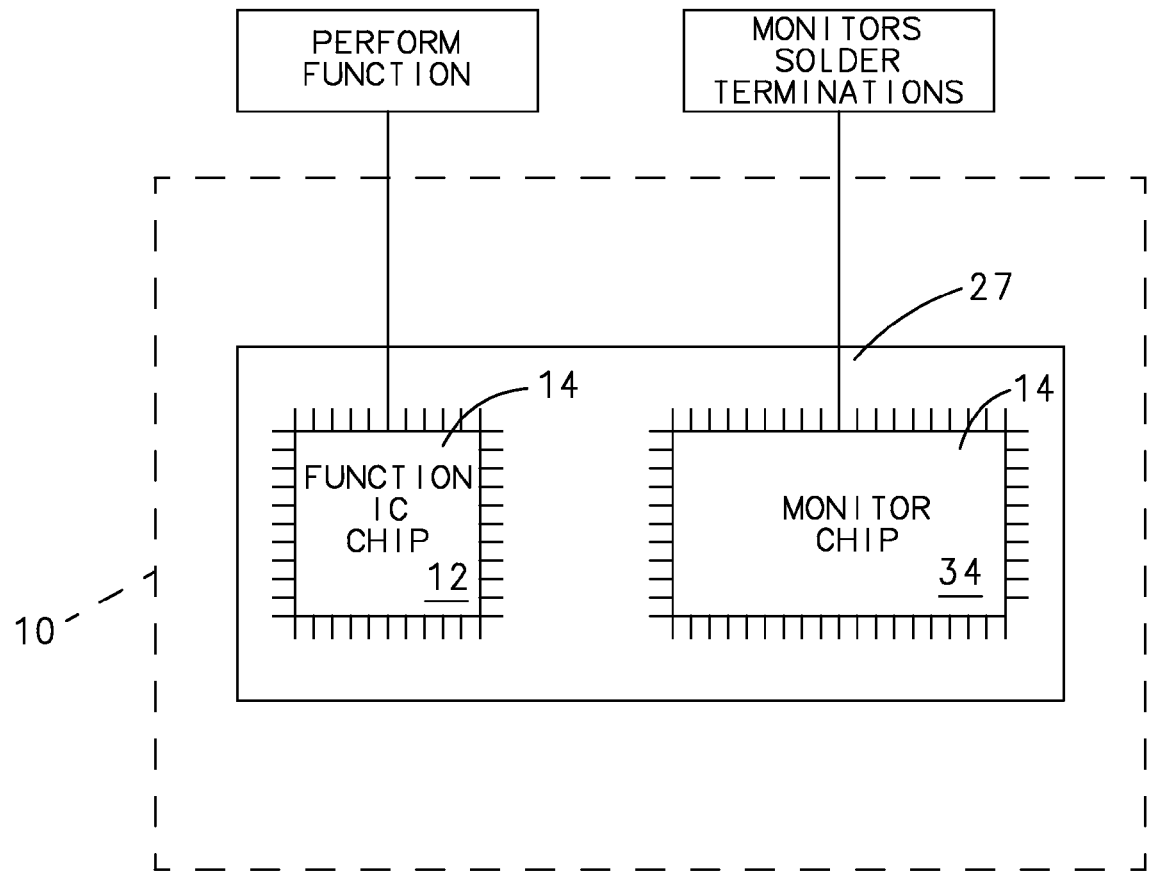
FIG. 4 is a block diagram of showing the co-placement of a functional integrated circuit and a monitoring integrated circuit package.

A monitor chip 34 proximate the function IC chip 12 is wire bonded to a BGA 14' with a number of wires 26 which mirror the wires 18 through a monitor pad pattern 28 having a multitude of pads 16' which mirrors pad pattern 20 (FIG. 2). Likewise, a complimentary substrate conductor pattern 30 having circuit traces 32 which mirror conductor pattern 22 and circuit traces 24. By mirroring the function IC chip 12 substrate interface with the monitor chip 34 substrate interface, the thermal and/or vibration-fatigue life of the IC chip 12 based on the life-environment actually experienced through monitoring of the monitor chip 34 is readily determined. Preferably, the function IC chip 12 and monitor chip 34 are located proximate each other on the PWB 27 such that the thermal and/or vibration-fatigue experienced thereby is essentially identical. That is, the monitor chip 34, having the same solder termination substrate interface as the function IC chip 12, experiences essentially the same thermal fatigue and/or mechanical vibration as the function IC chip 12 for the determination of total accumulated fatigue of the essentially identical solder terminations.

The monitor chip 34 includes monitoring or continuity circuits which determine the number and/or location of failed-open solder terminations of the solder termination PWB interface. The monitoring circuitry may contain daisy chain wiring, or other known circuitry that can be monitored with circuits internal or external of the monitor chip 34 to determine the percentage of total fatigue life experienced by the function IC chip. By utilizing the characteristic relationship of cycles and total stress to failure of the monitor chip 34 and function IC chip 24, the monitoring circuitry can determine the likely percentage of the design stress-to-failure that has likely occurred for the function IC chip 12 calculated, for example only, by Miner's rule of accumulated stress.

The large number of solder terminations using the monitor chip 34 facilitates calculation of the total accumulated fatigue using a large sample set of individual terminations which provides higher levels of accurate total fatigue estimation through large sample sizes than individual accumulated stress types of in-situ sensors.

Furthermore, the monitoring chip 34 monitoring circuit may be configured to be les durable than the function IC chip 12. That is, under-fill material or application characteristics may be modified to produce know-cycle-to-failure conditions for ball grid arrays that are les durable than that of the function IC chip 12. Other characteristics such as "glob top" or other encapsulation materials 35' (FIG. 1) or characteristics may be modified to produce the desired distributions of failed device-mounting terminations for measurements of the accumulated stress.

While the invention has been described above with reference to its use for the ball grid array package, the teachings of this invention is equally suited for use with flip chips or any other packaging method for electronics, as noted above.

It should be understood that although a particular component arrangement is disclosed in the illustrated embodiment, other arrangements will benefit from the instant invention.

Although particular step sequences are shown, described, and claimed, it should be understood that steps may be performed in any order, separated or combined unless otherwise indicated and will still benefit from the present invention.

The foregoing description is exemplary rather than defined by the limitations within. Many modifications and variations of the present invention are possible in light of the above teachings. The preferred embodiments of this invention have been disclosed, however, one of ordinary skill in the art would recognize that certain modifications would come within the scope of this invention. It is, therefore, to be understood that within the scope of the appended claims, the invention may be practiced otherwise than as specifically described. For that reason the following claims should be studied to determine the true scope and content of this invention.

What is claimed is:

1. An electronic component comprising:
   a printed circuit board;
   a function IC chip operable to perform a function distinct from a monitoring function and having a function IC chip solder termination pattern between said function IC chip and said printed circuit board; and
   a monitor chip having a monitor chip solder termination pattern between said monitor chip and said printed circuit board, said monitor chip solder termination pattern representative of said function IC chip solder termination pattern to determine an accumulated vibration stress fatigue experienced by said function IC chip.

2. The component as recited in claim 1, wherein said monitor chip solder termination pattern is identical to said function IC chip solder termination pattern.

3. The component as recited in claim 1, wherein said monitor chip includes monitoring circuitry which determines the number of failed-open solder terminations.

4. The component as recited in claim 1, wherein said vibration stress fatigue includes thermal fatigue.

5. The component as recited in claim 1, wherein said monitor chip includes monitoring circuitry which determines a number of monitor chip solder terminations within the monitor chip solder termination pattern that have failed and are electrically open such that the electrically open monitor chip solder terminations are associated with the accumulated stress fatigue.

6. The component as recited in claim 5, wherein said monitoring circuitry is operable to determine a percentage of the electrically open monitor chip solder terminations to determine the accumulated vibration stress fatigue.

7. The component as recited in claim 5, wherein said monitoring circuitry is operable to associating the electrically open monitor chip solder terminations with the accumulated stress fatigue from a life-environment actually experienced by the function IC chip.

8. The component as recited in claim 1, wherein said function IC chip solder termination pattern and said monitor chip solder termination pattern are on a common printed circuit board.

9. The component as recited in claim 1, wherein said function IC chip solder termination pattern is proximate said monitor chip solder termination pattern on a common printed circuit board.

10. The component as recited in claim 1, wherein said monitor chip is less durable than said function IC chip.

11. The component as recited in claim 3, wherein each of said failed open solder terminations is associated with an accumulated stress fatigue.

12. The component as recited in claim 3, wherein said function IC chip lacks said monitoring circuitry.

* * * * *